United States Patent

Hinohara

[11] Patent Number: 5,870,025
[45] Date of Patent: Feb. 9, 1999

[54] POWER-SUPPLY APPARATUS AND ITS MOUNTING-COMPLETION INDICATION METHOD

[75] Inventor: Makoto Hinohara, Tokyo, Japan

[73] Assignee: Canon Kabushiki Kaisha, Tokyo, Japan

[21] Appl. No.: 891,980

[22] Filed: Jul. 11, 1997

Related U.S. Application Data

[63] Continuation of Ser. No. 426,661, Apr. 21, 1995, abandoned.

[30] Foreign Application Priority Data

Apr. 26, 1994 [JP] Japan ................................. 6-110518

[51] Int. Cl.[6] ................................................ G08B 21/00
[52] U.S. Cl. ........................... 340/636; 340/635; 320/48; 324/427; 324/435
[58] Field of Search ..................................... 340/636, 635, 340/309.15; 429/90; 320/48; 324/426, 427, 435

[56] References Cited

U.S. PATENT DOCUMENTS

| | | | |
|---|---|---|---|
| 5,065,104 | 11/1991 | Kusko et al. | 324/508 |
| 5,164,702 | 11/1992 | Vogt | 340/505 |
| 5,321,627 | 6/1994 | Reher | 340/636 |
| 5,376,887 | 12/1994 | Saubolle | 340/636 |
| 5,406,188 | 4/1995 | Myslinski et al. | 340/636 |
| 5,406,266 | 4/1995 | Mino et al. | 340/636 |
| 5,416,402 | 5/1995 | Reher et al. | 340/636 |
| 5,420,493 | 5/1995 | Hargadon et al. | 320/15 |
| 5,424,721 | 6/1995 | Asai | 340/636 |
| 5,424,722 | 6/1995 | Inada et al. | 340/636 |
| 5,434,508 | 7/1995 | Ishida | 324/427 |

Primary Examiner—Jeffery Hofsass
Assistant Examiner—Ashok Mannava
Attorney, Agent, or Firm—Fitzpatrick, Cella, Harper & Scinto

[57] ABSTRACT

A battery pack and a device, each including a CPU, communicate with each other. When the battery pack is mounted to the device, the CPU of the device reads a voltage V, output from dry cells built in the battery pack, from a positive terminal. The CPU sends a ready signal, and compares the read dry-cell voltage V, and a dry-cell voltage included in dry-cell state information sent from the CPU of the battery pack, in response to the sent ready signal. When the voltages match, the CPU of the device outputs an LEDON signal corresponding to the remaining capacitance of the dry cells. The CPU of the battery pack turns on some of the LEDs, the number of which corresponds to the received LEDON signal for three seconds, to indicate to the user the remaining capacitance of the dry cells. This reports the user the remaining capacitance as well as an indication of the completion of mounting.

22 Claims, 8 Drawing Sheets

FIG. 2A READY

FIG. 2B CLOCK

FIG. 2C DATA

FIG. 3A READY
FIG. 3B DATA
FIG. 3C CLOCK

FIG. 5A

| FIRST BYTE | 1 | P | FOUR LOW-ORDER BITS OF REMAINING CAPACITY | 0 | 1 |

FIG. 5B

| SECOND BYTE | 1 | P | FOUR HIGH-ORDER BITS OF REMAINING CAPACITY | 0 | 0 |

FIG. 5C

| THIRD BYTE | 1 | P | FOUR LOW-ORDER BITS OF DRY-CELL VOLTAGE | 0 | 0 |

FIG. 5D

| FOURTH BYTE | 1 | P | FOUR HIGH-ORDER BITS OF DRY-CELL VOLTAGE | 0 | 0 |

FIG. 5E

| FIFTH BYTE | 1 | P | FOUR LOW-ORDER BITS OF DRY-CELL TEMPERATURE | 0 | 0 |

FIG. 5F

| LAST BYTE | 1 | P | FOUR HIGH-ORDER BITS OF DRY-CELL TEMPERATURE | 1 | 0 |

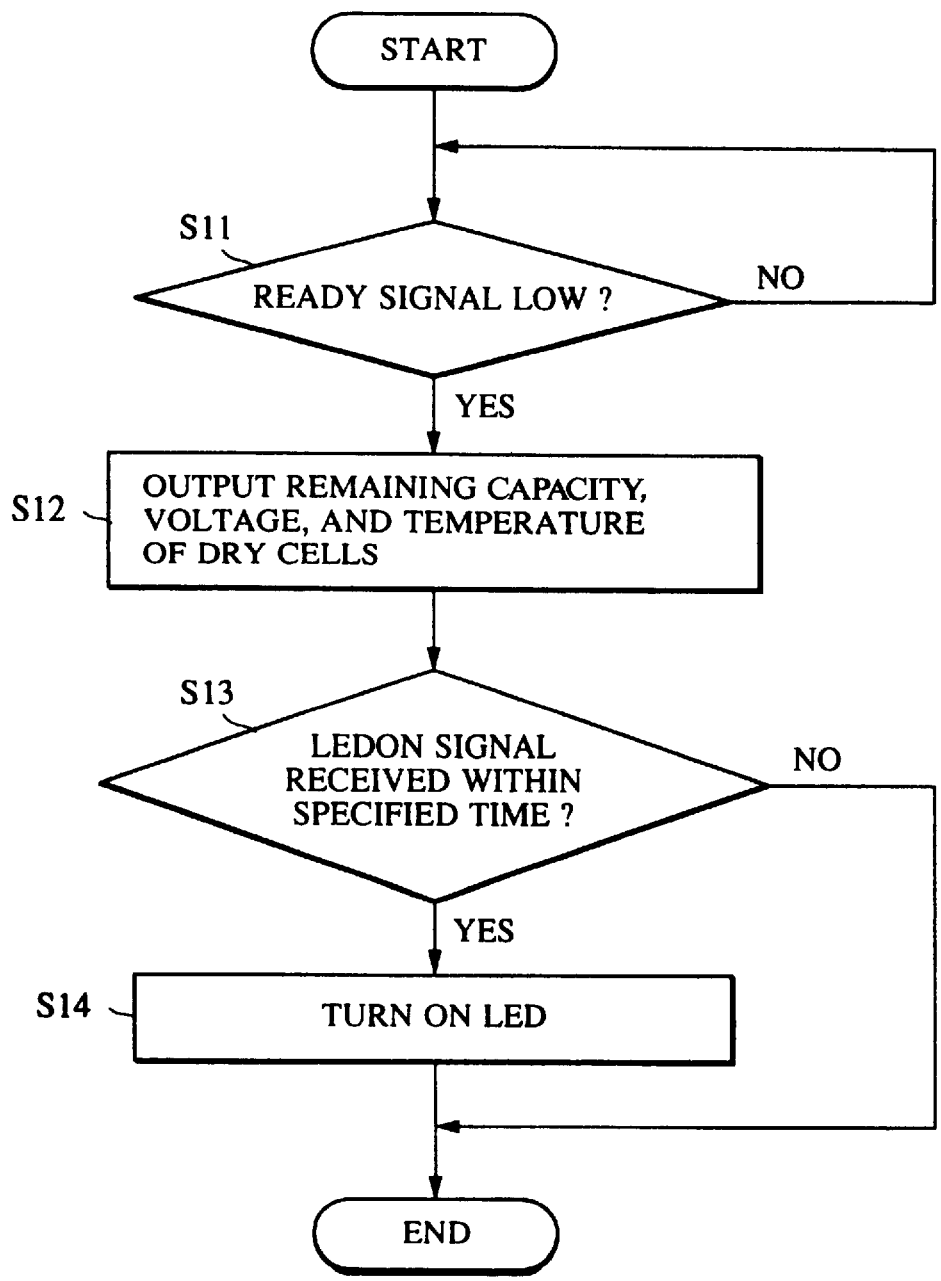

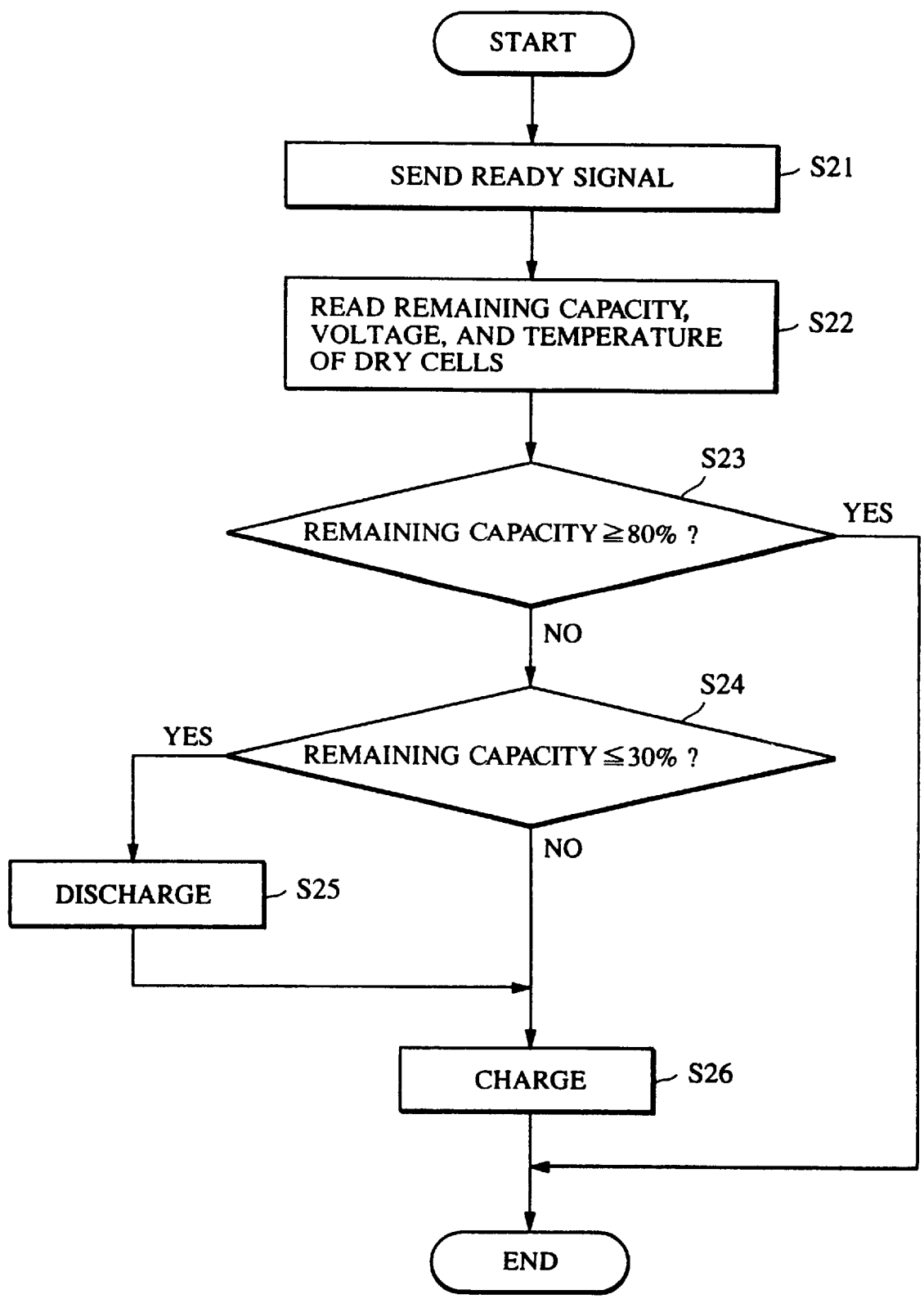

POWER-SUPPLY APPARATUS AND ITS MOUNTING-COMPLETION INDICATION METHOD

This application is a continuation of application Ser. No. 08/426,661, filed Apr. 21, 1995 now abandoned.

BACKGROUND OF THE INVENTION

1. Field of the Invention

The present invention relates to a power-supply apparatus and its mounting-completion indication method. The power-supply apparatus is used by incorporating a dry cell, or dry cells, in its body and mounting the body to a device.

2. Description of the Related Art

The following description of a battery pack, having a remaining-capacity indication, has been used as a power-supply apparatus for portable camcorders and portable computers. FIG. 9 shows a circuit diagram of the electric configuration of a conventional battery pack. The battery pack has a one-chip CPU 101, including an analog-to-digital converter 102; a resistor 103, for measuring a dry-cell charging current and discharging current; dry cells 104; a thermistor 105, for measuring the surface temperature of the dry cells 104; and LEDs 106, for indicating the remaining capacity of the dry cells 104. According to the remaining capacity of the dry cells, the number of LEDs lit changes. When the remaining capacity is 20% of the full capacitance, for example, one of the LEDs 106 lights. When the remaining capacity equals the full capacitance, all five of the LEDs 106 light. The battery pack further includes a push-button switch 107 for triggering the remaining-capacity indication, the switch causing the LEDs 106 to light for about three seconds when pressed once, then to go off; a positive terminal 108 of the battery pack connected to a device; and a negative terminal 109 of the battery pack connected to the device. The remaining capacity is calculated in the following way. The CPU 101 stores the initial capacity of the dry cells 104 in advance. The CPU obtains a charging current or discharging current from the voltage across the resistor 103, and calculates the remaining capacity. Assuming that the voltages at each end of the resistor 103, having a resistance of R, are a and b, respectively, the voltage difference between a and b is measured using the analog-to-digital converter 102 (voltage b is the voltage output from the dry cells 104). When a is smaller than b, the dry cells are determined to be being discharged. When a is larger than b, the dry cells are determined to be charging. The flowing current is calculated from equation (1) described below, using the voltage across the resistor 103.

Charging or discharging current=($|a-b|$/resistance $R$)×efficiency (1)

The charging efficiency and discharging efficiency are determined in advance according to the temperature. The temperature of the dry cells 104 is detected by the thermistor 105 as a voltage. The voltage is converted to a digital value, which the CPU 101 can deal with, by the analog-to-digital converter.

A current value, per unit of time calculated using expression (1), is added to the initial capacity when charging, and is subtracted from the initial capacity when discharging.

However, when a conventional battery pack is mounted to a device, there is no way to determine whether the battery pack has been correctly mounted to the device. In addition, it is difficult for a user to check the remaining capacity of the dry cells before using them, because the user must press the push-button switch 107 to check the remaining capacity. If the LEDs 106 are turned on to indicate the remaining capacity, the dry cells are then consumed, even when they are not being used for their intended purposes. When none of the LEDs 106 light, it cannot be determined whether the dry cells have completely discharged, or whether the battery is defective or mounted incorrectly. That is inconvenient.

SUMMARY OF THE INVENTION

Accordingly, it is an object of the present invention to provide a power-supply apparatus from which easily determines the completion of mounting of the power-supply apparatus to a device with which it is to be used, and its mounting-completion indication method.

This object is achieved, according to one aspect of the present invention, through the provision of a power-supply apparatus, which is used by incorporating a dry cell or dry cells in its body, and mounting the body to a device, comprising display means for indicating the completion of mounting for a certain time, using the dry cell or dry cells, when the body is connected to the device.

The foregoing object is achieved according to another aspect of the present invention through the provision of a power-supply apparatus in which the remaining capacity of a dry cell or dry cells is displayed upon the completion of mounting.

The foregoing object is achieved according to still another aspect of the present invention through the provision of a power-supply apparatus which is used by mounting its body, incorporating a dry cell or dry cells, to a device, the device comprising first communication means for communicating dry-cell state information with the body, when the body is mounted to the device, and problem determination means for determining whether the body is defective according to the transferred dry-cell state information, and the body comprising second communication means for communicating with the first communication means about the result of the problem determination and display means for indicating the determination result.

The foregoing object is achieved according to yet another aspect of the present invention through the provision of a mounting-completion indication method for a power-supply apparatus which is used by incorporating a dry cell or dry cells in its body and mounting the body to a device, comprising the step of displaying the completion of mounting for a certain time, using the dry cell or dry cells, when the body is mounted to the device.

The foregoing object is achieved according to further aspect of the present invention through the provision of a mounting-completion indication method for a power-supply apparatus which is used by incorporating a dry cell or dry cells in its body and mounting the body to a device, comprising a step where the device communicates dry-cell state information with the body, when the body is mounted to the device; a step where the device determines whether the body is defective according to the transferred dry-cell state information; a step where the device communicates the determination result with the body; and a step where the body displays the transferred determination result.

BRIEF DESCRIPTION OF THE DRAWINGS

FIG. 5 shows a transmission data sequence.

FIG. 7 is a flowchart indicating a communication control routine executed by the CPU 1.

FIG. 8 is a flowchart indicating a charging control routine executed by the CPU 15.

FIG. 9 is a circuit diagram showing a conventional battery pack.

DETAILED DESCRIPTION OF THE PREFERRED EMBODIMENTS

A power-supply apparatus and its mounting-completion indication method according to the present invention will be described below.

Figure 1:
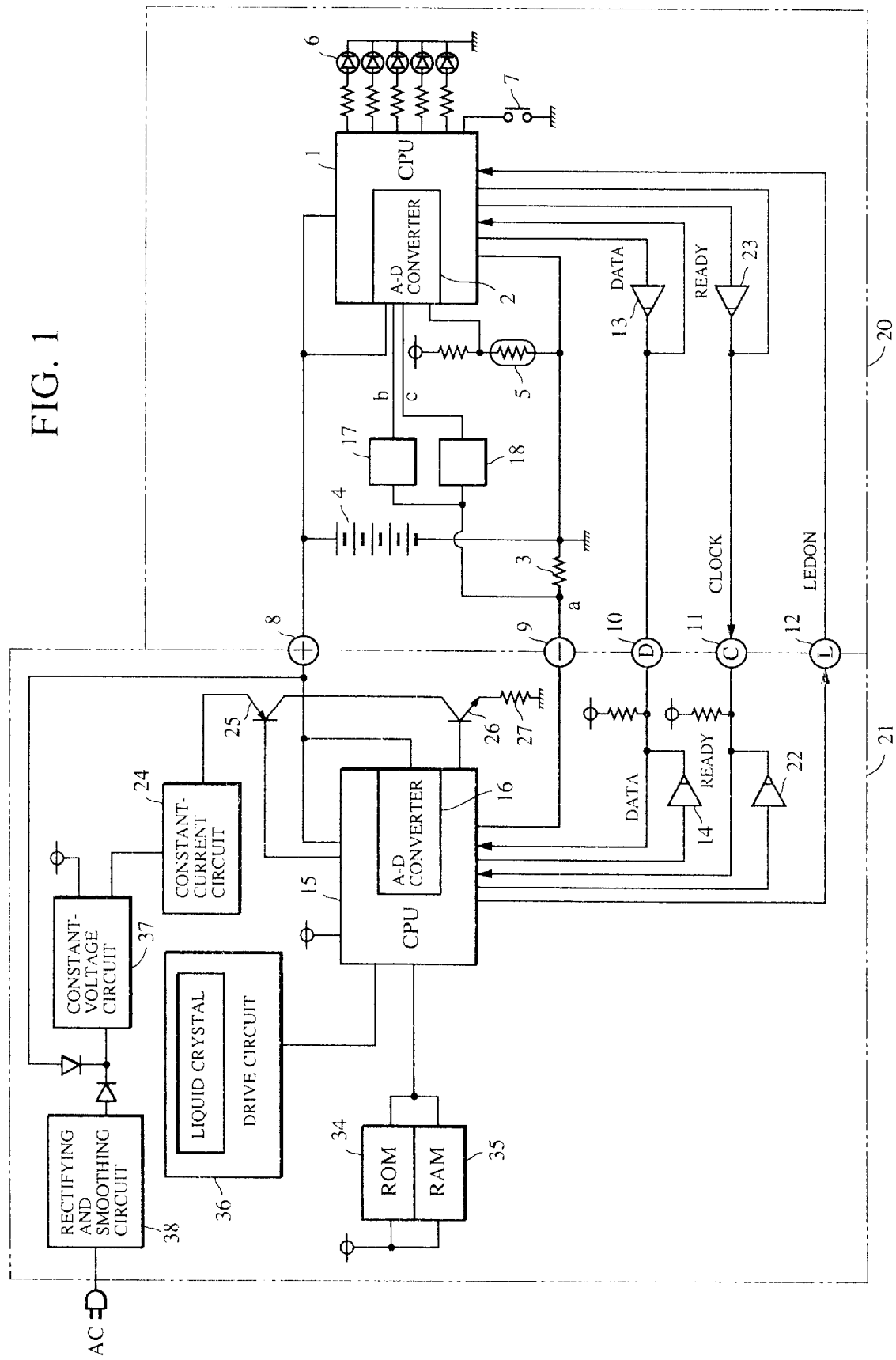
FIG. 1 is a circuit diagram illustrating the electric configuration of a battery pack 20 and a device 21.

FIG. 1 is a schematic diagram illustrating the electrical configuration of a battery pack 20 and a device 21, to which the battery pack is mounted. The battery pack 20 comprises a one-chip CPU 1 including an eight-bit analog-to-digital converter 2; a resistor 3 for measuring a charging and discharging current of dry cells 4, the resister being 0.02 ohms in this embodiment; an inverting amplifier 17 for amplifying the voltage at point a of the resistor 3, which has an amplification factor of approximately 80 in this embodiment; a non-inverting amplifier 18 for amplifying the voltage at point a of the resistor 3, which has the same amplification factor as the amplifier 17 (again, about 80 in this embodiment); the dry cells 4 having five NiCd cells connected in series; a thermistor 5 disposed near the dry cells 4 for measuring the surface temperature of the dry cells 4; LEDs 6 for indicating the capacity of the dry cells 4, one of the LEDs 6 lighting when the dry cells 4 have 0% to 19% of the full capacity, and all five of the LEDs 6 lighting when the dry cells 4 has 80% to 100% of the full capacity; a push-button switch 7, for turning on the remaining power-capacity display, i.e., the LEDs 6, for approximately three seconds when pressed once, and then turning it off; a positive terminal 8 of the battery pack 20, which supplies power to the device 21; a negative terminal 9 which also connects to the device 21; a data terminal 10, and a clock terminal 11, for transferring the battery-state information of the battery pack 20, to the device 21, and for transferring a device operation mode, to the battery pack 20, when the device 21 is suspended or in the off state, the data terminal 10 being used for a data signal (ready signal) and the clock terminal 11 being used for a clock signal; a terminal 12 used, for transferring an LEDON signal triggering the remaining capacity display; an open-collector driver 13 for transmitting a data signal; and an open-collector driver 23 for transmitting a clock signal. The device 21 includes an open-collector driver 14 for transmitting a ready signal; an open-collector driver 22 for transmitting a signal indicating the operation mode of the device 21; a one-chip CPU 15 including an analog-to-digital converter 16, for storing the calculated value of the remaining capacity of the dry cells 4, the dry-cell voltage, and the dry-cell temperature and for controlling charging and discharging; a rectifying and smoothing circuit 38 for converting 100 VAC to 10 VDC; and a constant-voltage circuit 37 which receives the power from the output (10 V) of the rectifying and smoothing circuit 38, or, the voltage (6 V) output from the NiCd dry cells 4, whichever is higher. When only the battery pack 20 is connected, for example, the constant-voltage circuit 37 receives the power from the battery pack 20. When only a 100 VAC line is connected, or when a 100 VAC line and the battery pack 20 are both connected, the constant-voltage circuit 37 receives the power from the 100 VAC line. The constant-voltage circuit 37 supplies a power of 5 V to the CPU 15 and internal circuits in the device 21. When a 100 VAC line and the battery pack 20 are both connected, the constant-voltage circuit 37 supplies a power of 10 V to a constant-current circuit 24. The CPU 15 stops operating when neither a 100 VAC line, nor the battery pack 20, is connected. When a 100 VAC line or the battery pack 20 is connected, the CPU 15 receives the 5 V power in the above-described manner and executes a communication control routine (described below) stored in a ROM 34, to communicate with the CPU 1. After the battery pack 20 is connected, the CPU 15 indicates to the user that the battery pack 20 has been connected to the device 21. The device further includes the constant-current circuit 24 for supplying a charging current to the dry cells 4; a switch circuit 25 for turning on or off the current supplied from the constant-current circuit 24; a switch circuit 26 for controlling discharging of the dry cells 4; a discharge resistor 27 for discharging the dry cells 4; ROM 34; RAM 35; and a liquid crystal 36 having a drive circuit.

Charging is started and stopped in the following way. When the dry cells 4 and a 100 VAC line are connected to the device, the CPU 15 reads the charging program shown in the flowchart of FIG. 8, from the ROM 34, and executes it. When the CPU 15 receives a charging instruction, the CPU 15 changes the ready signal from the high to low level and sends it through the driver 14 (step S21). When the reedy signal becomes low, the CPU 1 outputs through the driver 13 at the data terminal 10, to the device 21, the remaining capacity of the dry cells, the dry-cell voltage, and the dry-cell temperature (step S22). The CPU 15 analyzes the remaining capacity of the dry cells (step S23). When the capacity is 80% of the full capacity or more, the routine is terminated. When the capacity is less than 80% of the full capacity, the routine goes to the next step. The CPU 15 then analyzes the remaining capacity of the dry cells again (step S24). When the capacity is less than 30% of the full capacity, the dry cells 4 are discharged first, then charged, and the routine is terminated. When the capacity is 30% of the full capacity or more, the dry cells 4 are charged, and the routine is terminated. When the CPU 15 turns on the switch circuit 26, the dry cells 4 start being discharged. When the dry-cell voltage obtained from communication with the battery pack 20 reaches 5 V the CPU 15 turns off the switch circuit 26 to stop discharging (step S25). When the CPU 15 turns on the switch circuit 25, the dry cells 4 start being charged. When the dry-cell voltage obtained from communication with the battery pack 20 indicates that the voltage decreases by 60 mV from the peak voltage ($\Delta V=-60$ mV), the CPU 15 turns off the switch circuit 25 to stop charging (step S26).

The remaining capacity of the dry cells is calculated in the following way. The CPU 1 stores the initial capacity of the dry cells 4, the full capacity, in advance. The CPU 1 obtains a charging current or discharging current from the voltage across the resistor 3 at the specified time interval, to calculate a charged capacity or a discharged capacity from the product of the current value and the specified interval, then adds it to, or subtracts it from, the initial capacity. An example will be given below. The battery pack used in the present invention has a possible discharging current range of 0 A to 3.1 A and a possible charging current range of 0 A to 1.2 A. When the current falls in a range of 25 mA to 3.1 A, a current value detected by the analog-digital converter 2 is used for calculation of the remaining capacity. When the current falls in a range of 0 to 24 mA, a current value determined with the states of the data terminal 10, and clock terminal 11, is used for the calculation.

The remaining capacity of the dry cells is calculated in the following way when a current value detected by the analog-to-digital converter 2 is used for the calculation.

Changes in current from 12.5 mA to 3.125 A which flows through the resistor 3, having a resistance of 0.02 ohms, are converted to those in voltage from 0.25 mV to 62.5 mV (at point a). The voltage is then amplified with a factor of 80 by the inverting amplifier 17, or the non-inverting amplifier 18, (let the voltage output from the inverting amplifier 17 be b, and that output from the non-inverting amplifier 18 be c), the corresponding changes in voltage being 20 mV to 5.0 V (voltage b or c). Since the analog-to-digital converter 2 used in this embodiment has a resolution of eight bits at a voltage range of 0 to 5 V, a voltage of about 20 mV can be detected per one bit. This voltage, about 20 mV, corresponds to a current of 12.5 mA flowing through the resistor 3. Because the analog-to-digital converter 2 has an error at the least significant bit, the minimum detectable current is set to 25 mA, which corresponds to two bits. When the CPU 1 detects a current of 25 mA or more, it determines that the dry cells 4 are being charged or discharged. The CPU 1 stores the initial capacity of the dry cells 4 in an internal ROM (not shown), calculates a charging current or discharging current from the voltage at point a of the resistor 3, converts the obtained current to a current per the unit of time, and adds it to (in charging) or subtracts it from (in discharging), the remaining capacity of the dry cells 4. The voltage at point a of the resistor 3 is amplified by the inverting amplifier 17 or the non-inverting amplifier 18, and is then converted by the analog-to-digital converter 2. When b is positive, the dry cells are determined to be charging. From the value output from the analog-to-digital converter 2 corresponding to b, a charging current is calculated using equation (2). When c is positive, the dry cells are determined to be discharging. From the value output from the analog-to-digital converter 2 corresponding to c, a discharging current is calculated using equation (2). In either case, the CPU 1 obtains the digital value of the current.

Charging or discharging current=(voltage b or c)/resistance R)×efficiency (2)

The charging efficiency and discharging efficiency have been determined in advance according to the temperature. The temperature of the dry cells 4 is detected by the thermistor 5 as a voltage. The voltage is then converted to a digital value, which the CPU 1 can handle, in the analog-to-digital converter 2. The CPU 1 calculates the charged capacity or the discharged capacity using expression (3) from the obtained charging current or discharging current.

Charged or discharged capacity=(charging or discharging current)× sampling time (3)

The sampling time has been determined in advance, being 1 ms in this embodiment. The remaining capacity of the dry cells 4 is obtained by adding a charged capacity per sampling time to, or by subtracting a discharged capacity per sampling time from, the initial capacity, for each sampling time. While the dry cells are determined to be charging from the current obtained from the voltage at point a of the resistor 3, the CPU 1 turns on some of the LEDs 6 the number of which corresponds to the remaining capacity of the dry cells. When the dry cells are determined to be discharging from the current obtained from the voltage at point a of the resistor 3, and when the capacity falls in a range of 0% to 19% of the full capacity, the CPU 1 automatically lights one of the LEDs 6. The CPU 15 sends a signal to the liquid crystal 36 having the drive circuit, and also sends an LEDON signal. When the CPU 1 receives the LEDON signal, it turns on the LEDs 6 in the same way as when the push-button switch 7 is pressed.

The remaining capacity of the dry cells is calculated in the following way when a charging or discharging current cannot be detected by the analog-to-digital converter 2.

When the analog-to-digital converter 2 cannot detect a charging or discharging current, the device is suspended or in the off state. The dry cells 4 supply a current of 7 mA when the device is suspended and a current of 3 mA when the device is in the off state. When the analog-to-digital converter 2 cannot detect a charging or discharging current, the CPU 1 finds that the device 21 is suspended or is in the off state, using the states of the data terminal 10 and clock terminal 11 as described below. When the device is determined to be suspended, a current of 7 mA per the unit of time is subtracted from the remaining capacity of the dry cells. When the device is determined to be in the off state, a current of 3 mA per the unit of time is subtracted from the remaining capacity.

Communication between the battery pack 20 and the device 21 will be described below.

When the device 21 is suspended, the CPU 15 of the device makes the ready signal high, through the driver 14, and makes the clock signal low, through the driver 22. The CPU 1 reads the states of the data terminal 10 and the clock terminal 11.

When the device 21 enters the off state, the CPU 15 of the device makes the ready signal high, through the driver 14, and makes the clock signal high, through the driver 22. The CPU 1 reads the states of the data terminal 10 and the clock terminal 11.

When the device enters a charging state, discharging state or operating state, the following takes place.

Figure 2:
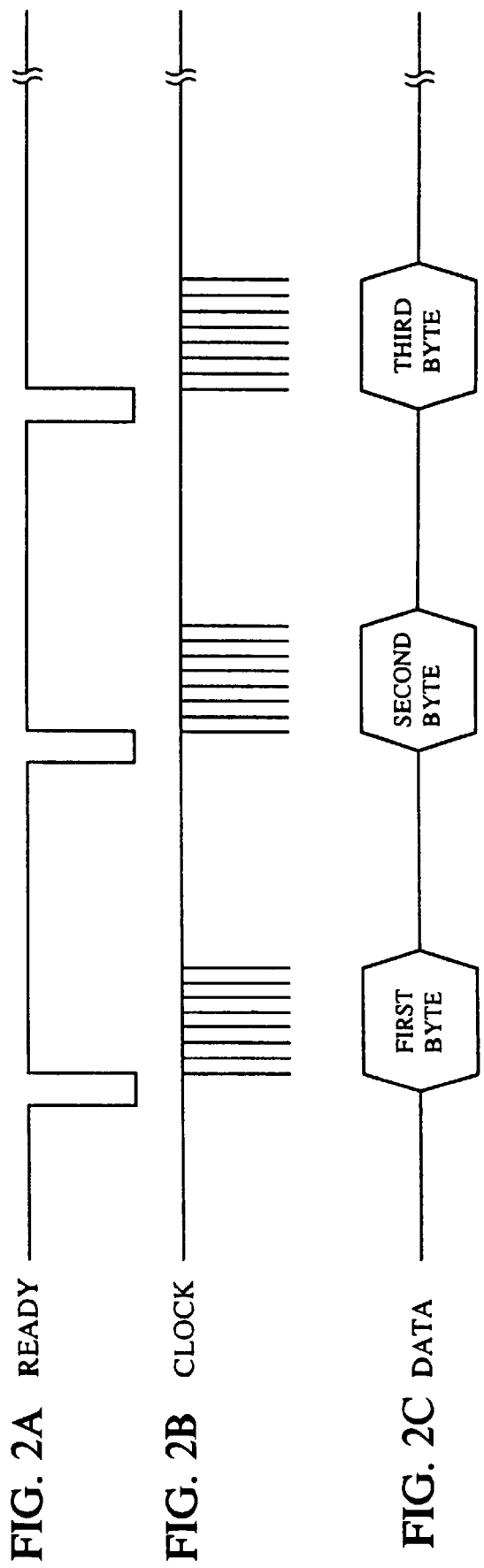
FIG. 2 illustrates timing for transmitting six bytes (one block) of data.
Figure 3:
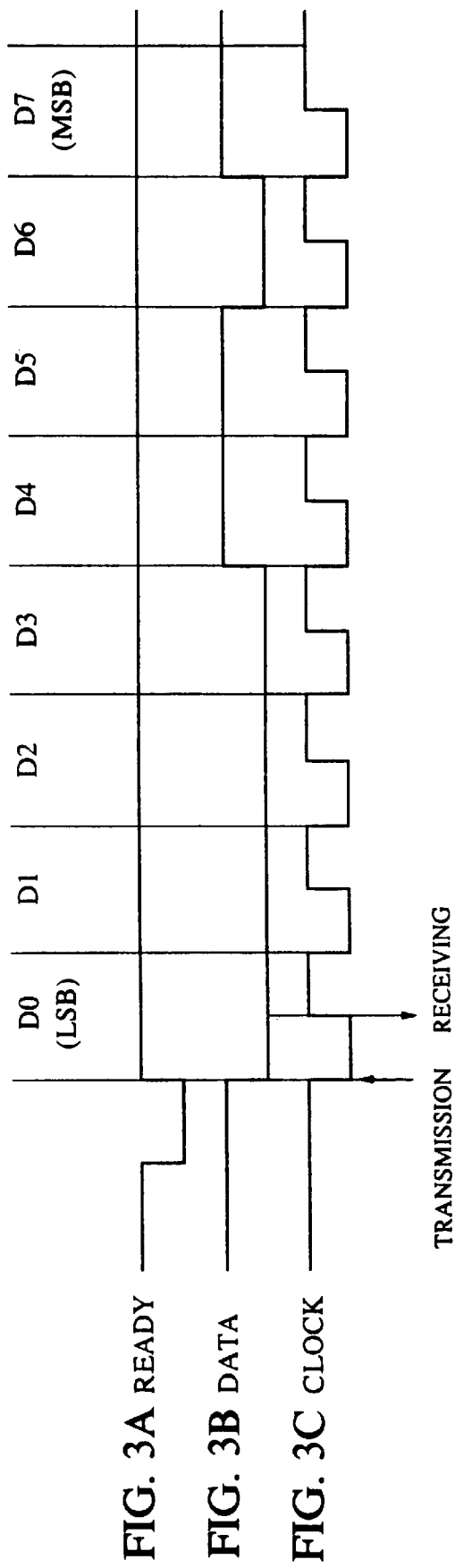
FIG. 3 illustrates timing for transmitting one byte of data.

FIG. 2 shows timing for transmitting six bytes (one block) of data. FIG. 3 illustrates timing for transmitting one byte of data. The CPU 15 of the device 21 sets, through the driver 14, the ready signal low for a certain period, then high. When the CPU 1 of the battery pack detects a low-level ready signal, it assumes that the CPU 15 is ready for receiving data. The CPU 1 sends data through the driver 13, at the data terminal 10, in synchronization with the falling edge of the clock signal. The data consists of eight bits from the least significant bit to the most significant bit. The CPU 15 receives the data sent from the CPU 1 in synchronization with the rising edge of the clock signal (see FIG. 3). One-byte transmission, illustrated in FIG. 3, is repeated six times to send six bytes of data.

Figure 4:
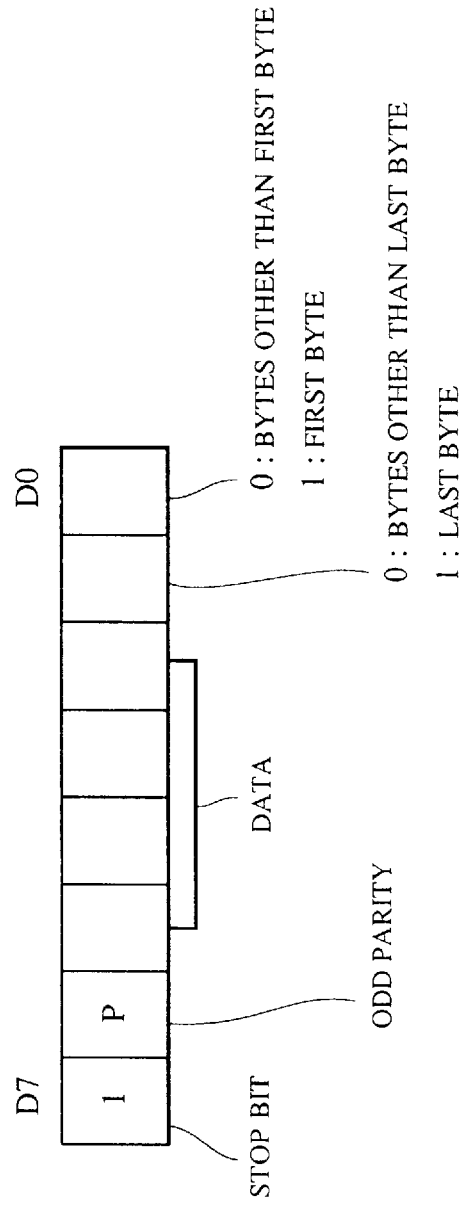
FIG. 4 shows the format of transmission data.

FIG. 4 shows the format of transmission data. Data comprises a stop bit D7, an odd-parity bit D6, data bits D5 to D2, a last-byte indication bit D1, and a first-byte indication bit D0. The first-byte indication bit is set to 1 for the first byte of transmission data. The last-byte indication bit is set to 1 for the last byte of transmission data.

FIG. 5 shows a transmission data sequence. From the first byte of data to the last byte, each byte holds the four low-order bits of the remaining capacity, four high-order bits of the remaining capacity, four low-order bits of the dry-cell voltage, four high-order bits of the dry-cell voltage, four low-order bits of the dry-cell temperature, and four high-order bits of the dry-cell temperature, respectively. Data of the remaining capacity consisting of eight bits, ranges from 0% to 100%. Data of the dry-cell voltage, consisting of eight bits, ranges from 0 to 10.24 V. Data of the dry-cell temperature, consisting of eight bits, ranges from −5 to 71.8 degrees centigrade.

Figure 6:
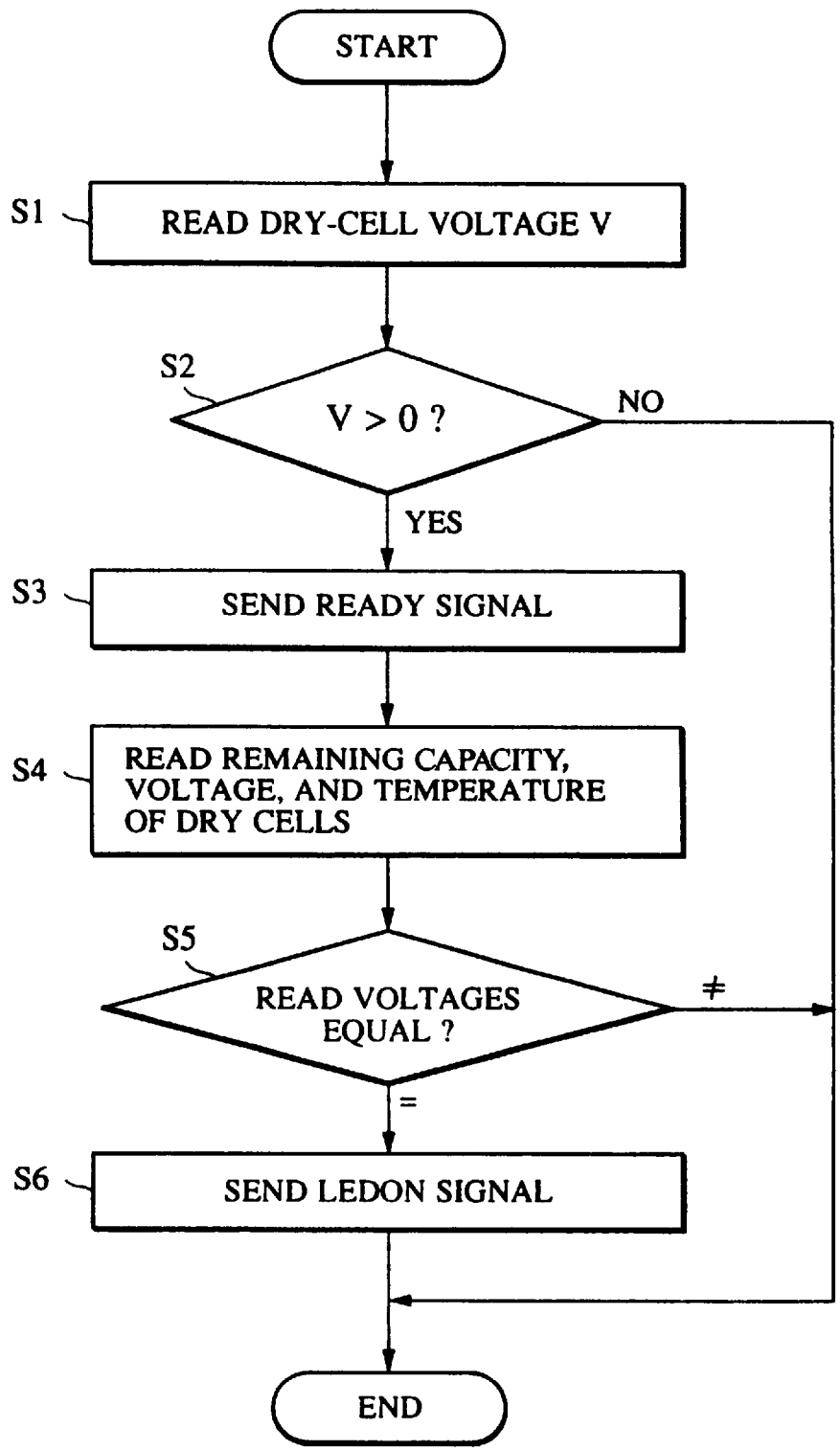
FIG. 6 is a flowchart indicating a communication control routine executed by the CPU 15.

The user can check the remaining capacity of the dry cells, in the procedure described below, after connecting the battery pack 20 to the device 21. FIG. 6 is a flowchart indicating a communication control routine executed by the CPU 15. The CPU 15 uses the analog-to-digital converter 16, to read the dry-cell voltage V, at the positive terminal 8 (step S1). The CPU determines whether the read dry-cell voltage V exceeds 0 V or not (step S2). When the voltage exceeds 0 V, the CPU 15 recognizes that the battery pack 20 has been connected to the device 21 and the routine proceeds to step S3. When the dry-cell voltage is 0 V or less, this routine is terminated. The CPU 15 sends a ready signal and prepares for receiving data (step S3), as described above. The CPU 15 reads the data of the remaining capacity of the dry cells 4, the dry-cell voltage, and the dry-cell temperature all sent from the CPU 1 (step S4). Then, the CPU 15 compares the dry-cell voltage V, read through the analog-to-digital converter 16 in step S1, with the dry-cell voltage obtained through communication (step S5). When they are equal, the CPU 15 sends an LEDON signal (step S6). When the CPU 1 receives the LEDON signal, it turns on the LEDs 6 for three seconds, in the same way as when the push-button switch 7 is pressed.

FIG. 7 is a flowchart illustrating a communication control routine executed by the CPU 1.

This routine is executed in communication with the communication control routine executed by the CPU 15 shown in FIG. 6. When the battery pack 20 is mounted to the device 21, the CPU 1 waits for the ready signal to change from high to low (step S11). When the ready signal becomes low, the CPU 1 outputs data of the remaining capacitance of the dry cells, the dry-cell voltage, and the dry-cell temperature, through the driver 13, at the data terminal 10, to the device 21 (step S12). Then, the CPU 1 waits for receiving of the LEDON signal sent from the CPU 15 (step S13). When the CPU 1 does not receive the LEDON signal within a specified time, the routine is terminated. When the CPU 1 receives the LEDON signal, the CPU 1 turns on the corresponding LED of the LEDs 6 (step S14).

In this embodiment, when the battery pack 20 is mounted to the device, the remaining capacity of the dry cells are automatically indicated. Since the remaining capacity is displayed for a certain time (three seconds), unlike a conventional battery pack, this battery pack does not require the user to press a push-button switch to check the capacity before using the dry cells. In addition, the dry cells are not consumed because the LED display is on only for a short period. If no LED lights when a conventional battery pack is used, it is inconvenient for the user to determine whether the dry cells are completely exhausted or whether the battery pack is defective. When a new battery pack is used, if the LEDs do not light, it is immediately determined that the battery pack is defective. In this embodiment, when the LEDON signal is not transmitted, namely when the battery pack is determined to be defective, the CPU 1 does not light the LEDs 6 to report to the user that the battery pack is defective. The CPU 1 may blink the LEDs 6 rather than turning off the LEDs 6.

In this embodiment, the main operation of the CPU 1 is calculating the remaining capacitance of the dry cells, measuring the dry-cell voltage and the dry-cell temperature, and displaying the remaining capacity with the LED 6. The main operation of the CPU 15 is the charging and discharging control of the battery pack 20 and communication start control.

As described above, when a power-supply apparatus according to the present invention which is used by incorporating dry cells in its body and mounting the body to a device is used, the apparatus indicates the completion of mounting, on display means, for a certain time, using the dry cells when the body is mounted to the device. Therefore, the user can easily confirm that the apparatus has been mounted correctly. In addition, the completion of mounting is displayed for only a certain time, thereby preventing the unnecessary use of the dry cells.

Since a power-supply apparatus according to the present invention indicates the completion of mounting by the remaining capacity of dry cells incorporated, the user can detect the remaining capacity as well as the completion of mounting. This also enables the user to determine whether the apparatus is defective or has discharged the dry cells.

When using a power-supply apparatus according to the present invention, which is used by mounting its body incorporating dry cells to a device, when the body is mounted to the device, the device receives dry-cell state information from the body via first communication means, and determines whether the body is defective according to the transferred dry-cell state information, using problem determination means. The battery is determined to be defective when the LEDON signal from the CPU 15 has not been transmitted to the CPU 1. The LEDON signal is not transmitted on the following two bases. First, the CPU 15 uses the analog-to-digital converter 16 to read the dry-cell voltage V at the positive terminal (step S1 of FIG. 6). The CPU 15 determines whether the read dry-cell voltage V exceeds 0 V or not (step 2 of FIG. 6). The LEDON signal is not sent if the read dry-cell voltage V does not exceed 0 V. Secondly, the CPU 15 reads the data of the remaining capacity of the dry cells 4, the dry-cell voltage, and the dry cell temperature all sent from the CPU 1 (step 4 of FIG. 6). Then, the CPU 15 compares the dry-cell voltage V, read through the analog-digital converter 16 in step S1, with the dry-cell voltage obtained through communication (step S5 of FIG. 6). The LEDON signal is not sent if the dry-cell voltage V is not equal to the dry-cell voltage communicated to the CPU 15. The CPU 1 waits for the LEDON signal for a specified period of time. After the CPU 1 times out waiting for the LEDON signal, the battery is deemed defective by the CPU 1. The body communicates with the problem determination means the result of the problem determination, using second communication means, and displays the result with display means. Therefore the user quickly understands whether the power-supply apparatus is defective when the body is mounted.

When a mounting-completion indication method, according to the present invention, is used for a power-supply apparatus, which is used by incorporating dry cells in its body and mounting the body to a device, the apparatus indicates the completion of mounting for a certain time, using the dry cells, when the body is mounted to the device. Therefore, the user can easily confirm that the body has been mounted correctly. In addition, the completion of mounting is displayed for only a certain time, thereby preventing the unnecessary use of the dry cells.

When a mounting-completion indication method according to the present invention is used for a power-supply apparatus, which is used by mounting its body incorporating dry cells to a device, when the body is mounted to the device, the device receives dry-cell state information from the body, determines whether the body is defective according to the transferred dry-cell state information, and transfers the determination result to the body. The body displays the transferred result. Therefore the user quickly understands whether the power-supply apparatus is defective when the body is mounted.

What is claimed is:

1. A power-supply apparatus, comprising:
   a body incorporating at least one dry cell, said body capable of being mounted to a charging device; and
   a display means for automatically displaying the remaining capacity of said at least dry cell for a predetermined time after said body has been mounted to the charging device, said predetermined time interval being less than an entire time the body is mounted to the charging device.

2. An apparatus according to claim 1, further comprising instruction means for instructing the display of the remaining capacity of said at least one dry cell, wherein said display means displays the remaining capacity of said at least one dry cell for the predetermined time interval based on an instruction from said instructing means.

3. An apparatus according to claim 1, wherein said display means comprises a plurality of LEDs and displays the remaining capacity of said at least one dry cell by lighting one or more of the LEDs.

4. An apparatus according to claim 1, further comprising calculating means for determining the remaining capacity of said at least one dry cell.

5. An apparatus according to claim 4, further comprising a resistor connected to said at least one dry cell, wherein said calculating means determines the remaining capacity of said at least one dry cell based on the direction of electric current flowing through said resistor.

6. A power-supply system comprising:
   a charging device comprising:
   first communication means for receiving dry-cell state information from a body of a power-supply apparatus when said body is mounted to said charging device; and
   problem determination means for determining whether said body is defective or not defective according to the communicated dry-cell state information before charging begins; and
   said power-supply apparatus comprising:
   said body incorporating at least one dry cell;
   second communication means for receiving a signal indicating that said body is not defective from said problem determination means of said charging device; and
   display means for displaying the determination using the received signal.

7. A power-supply apparatus according to claim 6, wherein said display means displays said determination result for a predetermined time interval.

8. A system according to claim 6, wherein said power-supply apparatus further comprises instruction means for instructing the display of the remaining capacity of said at least one dry cell, wherein said display means displays the remaining capacity of said at least one dry cell for a predetermined time interval based on an instruction from said instructing means.

9. A system according to claim 6, wherein said display means of said power-supply apparatus comprises a plurality of LEDs and displays the remaining capacity of said at least one dry cell by lighting one or more of the LEDs.

10. A system according to claim 6, wherein said power-supply apparatus further comprises calculating means for determining the remaining capacity of said at least one dry cell.

11. A system according to claim 10, wherein said power-supply apparatus further comprises a resistor connected to said at least one dry cell, wherein said calculating means determines the remaining capacity of said at least one dry cell based on the direction of electric current flowing through said resistor.

12. A mounting-completion indication method, for a power-supply apparatus having at least one dry cell in its body and mounting the body to a charging device, comprising the step of:
    displaying automatically the remaining capacity of the at least dry cell for a predetermined time after the body has been mounted to the charging device, where the predetermined time interval is less than an entire time the body is mounted to the charging device.

13. A method according to claim 12, further comprising the step of instructing the display of the remaining capacity of the at least one dry cell, where in said displaying step, the remaining capacity of the at least one dry cell is displayed for the predetermined time interval based on an instruction of said instructing step.

14. A method according to claim 12, wherein the power-supply apparatus comprises a plurality of LEDs, and the remaining capacity of the at least one dry cell is displayed by lighting one or more LEDs of the plurality of LEDs.

15. A method according to claim 12, further comprising the step of determining the remaining capacity of the at least one dry cell.

16. A mounting-completion indication method, for a power-supply system including a charging device and a power supply apparatus having at least one dry cell, comprising the steps of:
    a first step, wherein a body of the power supply apparatus communicates dry-cell state information to the charging device when the body is mounted to the charging device;
    a second step, wherein the charging device determines whether the body is defective or not defective according to the dry-cell state information communicated in the first step before charging begins;
    a third step, wherein the power supply apparatus receives a signal indicating that the body is not defective; and
    a fourth step, wherein the body displays the determination result using the received signal.

17. A mounting-completion indication method according to claim 16, further comprising a fifth step, wherein the body stops displaying the determination result after a predetermined time interval.

18. A method according to claim 15, wherein the power-supply apparatus further comprises a resistor connected to the at least one dry cell, and in said determining step the remaining capacity of the at least one dry cell is determined based on the direction of electric current flowing through the resistor.

19. A method according to claim 16, further comprising the step of instructing the display of the remaining capacity of the at least one dry cell, where in said displaying step, the remaining capacity of the at least one dry cell is displayed for a predetermined time interval based on an instruction of said instructing step.

20. A method according to claim 16, wherein the power-supply apparatus comprises a plurality of LEDs, and the remaining capacity of the at least one dry cell is displayed by lighting one or more LEDs of the plurality of LEDs.

21. A method according to claim 16, further comprising the step of determining the remaining capacity of the at least one dry cell.

22. A method according to claim 21, wherein the power-supply apparatus further comprises a resistor connected to the at least one dry cell, and in said determining step the remaining capacity of the at least one dry cell is determined based on the direction of electric current flowing through the resistor.

* * * * *